(12) United States Patent
Owen

(10) Patent No.: US 7,248,332 B2
(45) Date of Patent: Jul. 24, 2007

(54) LITHOGRAPHIC APPARATUS AND DEVICE MANUFACTURING METHOD

(75) Inventor: Cassandra May Owen, Chandler, AZ (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/889,066

(22) Filed: Jul. 13, 2004

(65) Prior Publication Data

US 2006/0012760 A1  Jan. 19, 2006

(51) Int. Cl.
 *G03B 27/52* (2006.01)
 *G03B 27/58* (2006.01)
(52) U.S. Cl. .......................... 355/30; 355/72
(58) Field of Classification Search ............ 355/30, 355/53, 67, 72
See application file for complete search history.

(56) References Cited

U.S. PATENT DOCUMENTS

| 6,232,613 | B1 * | 5/2001 | Silfvast et al. ............ 250/504 R |
| 6,492,067 | B1 * | 12/2002 | Klebanoff et al. ............ 430/5 |
| 6,642,531 | B1 * | 11/2003 | Powers .................... 250/492.2 |
| 6,781,673 | B2 * | 8/2004 | Moors et al. ................ 355/76 |
| 2004/0180271 | A1 * | 9/2004 | Enloe ............................ 430/5 |
| 2004/0218157 | A1 * | 11/2004 | Bakker et al. ................ 355/30 |
| 2004/0218168 | A1 * | 11/2004 | Van Groos et al. ........... 355/72 |
| 2005/0174549 | A1 * | 8/2005 | Duineveld et al. ............ 355/30 |

* cited by examiner

*Primary Examiner*—Peter B. Kim
*Assistant Examiner*—Marissa A. Ohira
(74) *Attorney, Agent, or Firm*—Pillsbury Winthrop Shaw Pittman LLP

(57) ABSTRACT

A lithographic apparatus is provided with a charged object on a projection system of the lithographic apparatus, a substrate table of the lithographic apparatus, or both that is configured to have an electric charge to attract particles thereto.

18 Claims, 4 Drawing Sheets

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

Sulfur dioxide, organic phosphates, amines, and oxygen are contaminants typically found in a lithographic apparatus that may decrease the yield of good dies by attaching to the substrates, to the projection system of the lithographic apparatus, or to other sensitive parts of the lithographic apparatus. While the internal and external ambient atmosphere of the lithographic apparatus is typically controlled to reduce the levels of such contaminants, there is however invariably some level of contamination of sensitive parts of the lithographic apparatus or contamination of materials supplied to the lithographic apparatus. For example, contaminants may be introduced into the ambient atmosphere via an incoming substrate, outgassing of materials, leakage of contaminated gas into the lithographic apparatus, maintenance of the lithographic apparatus by personnel, etc.

SUMMARY

Accordingly, it would be advantageous, for example, to provide a lithographic apparatus capable of reduced contamination.

According to an aspect, there is provided a lithographic apparatus comprising:

an illuminator arranged to provide a beam of radiation;

a support structure configured to hold a patterning device, the patterning device configured to impart the beam with a pattern in its cross-section;

a substrate table configured to hold a substrate;

a projection system arranged to project the patterned beam onto a target portion of the substrate; and a charged object on the projection system, the substrate table, or both configured to have an electric charge to attract particles thereto.

In an embodiment, the charged object has a negative electric charge to attract positively charged particles and/or the charged object has a positive charge to attract negatively charged particles.

Optionally, a particle disposal mechanism configured to retain, remove, or both particles attracted to the charged object is provided. In an embodiment, the particle disposal mechanism comprises a retaining substance provided to the charged object to hold particles attracted to the charged object. In an implementation, the retaining substance comprises a layer of neutral gel or adhesive to hold the particles.

In an embodiment, a substrate handler may be configured to remove or clean the retaining substance.

In an embodiment, the charged object is on the substrate table and is configured as a ring to surround a substrate when placed on the substrate table. Alternatively or in addition, the charged object may be on the projection system and configured as a ring to surround a last optical element of the projection system before the substrate table.

In an embodiment, the charged object is insulated at least in part so as not to provide a charge to the substrate table, the projection system, or both.

According to a further aspect, there is provided a device manufacturing method comprising:

projecting a patterned beam of radiation, using a projection system of a lithographic apparatus, onto a target portion of a substrate held on a substrate table of a lithographic apparatus; and using an electric charge on the projection system, the substrate table, or both to attract particles thereto.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion liquid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling a beam of radiation to be projected onto the substrate, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein all or part of a surface of the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
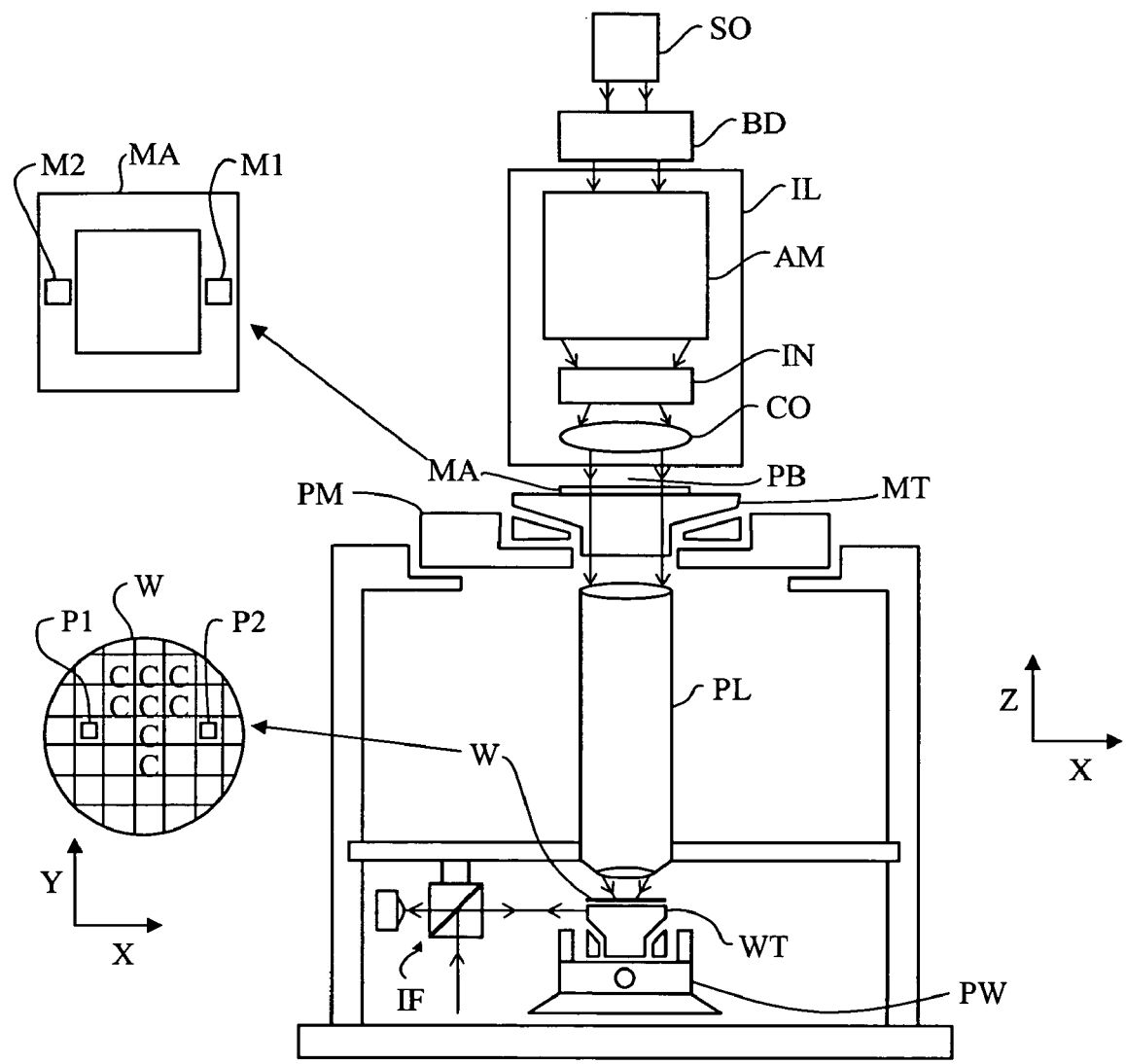
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL arranged to provide a beam PB of radiation (e.g. UV or EUV radiation).

a support structure (e.g. a mask table) MT configured to hold a patterning device (e.g. a mask) MA and connected to a first positioner PM configured to accurately position the patterning device with respect to projection system PL;

a substrate table (e.g. a wafer table) WT configured to hold a substrate (e.g. a resist-coated wafer) W and connected to a second positioner PW configured to accurately position the substrate with respect to projection system PL; and a projection system (e.g. a reflective projection lens) PL arranged to image a pattern imparted to the beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB having a desired uniformity and intensity distribution in its cross-section.

The beam PB is incident on the mask MA, which is held on the mask table MT. Having traversed the mask MA, the beam PB passes through the lens PL, which focuses the beam as patterned onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioner(s) PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
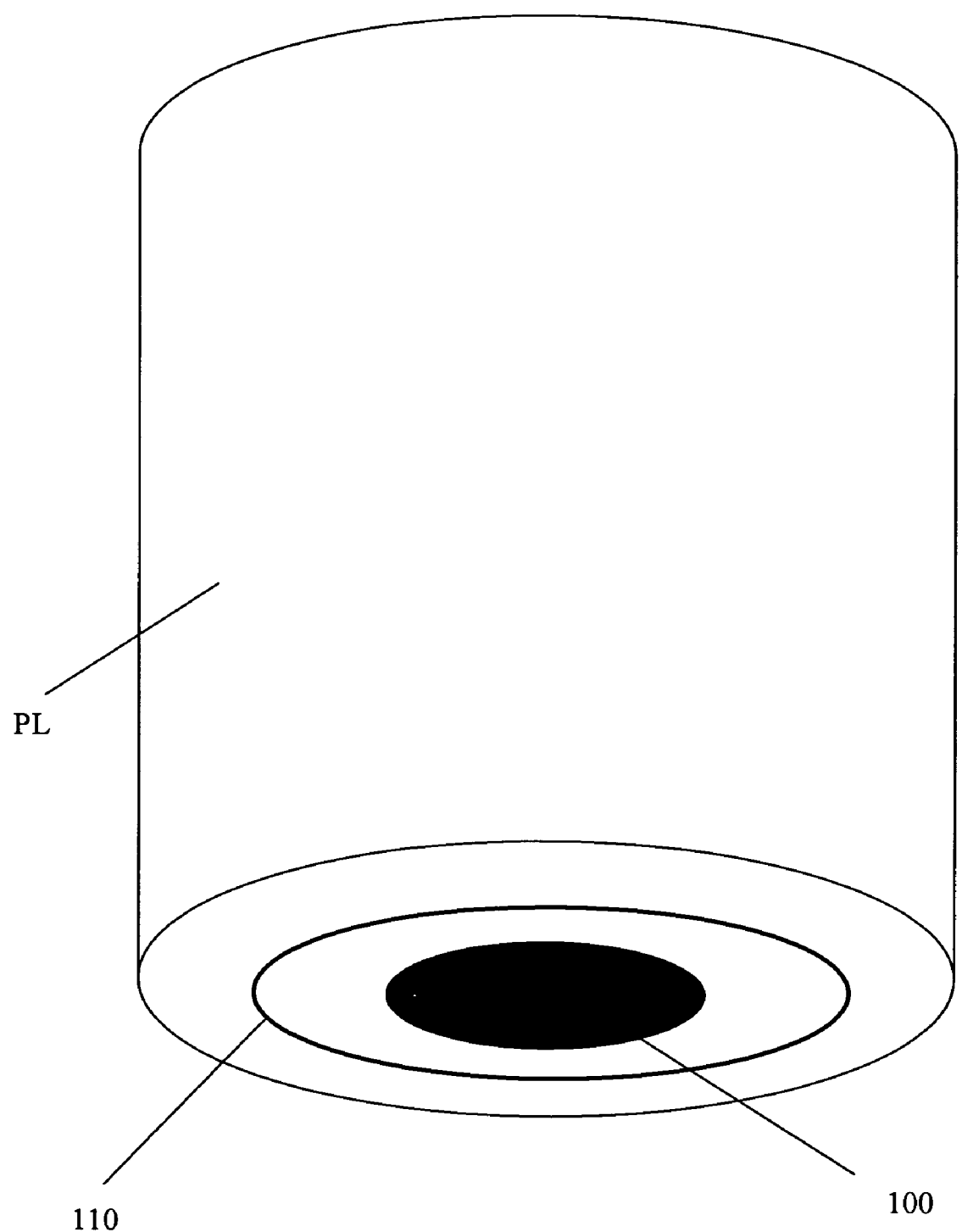
FIG. 2 depicts a projection system having a charged object according to an embodiment of the invention.

Referring to FIG. 2, the projection system PL of FIG. 1 is shown in more detail. A charged object 110 is provided on the projection system PL. In an embodiment, the charged object 110 is a wire ring having a negative charge capable of attracting particles to the wire. According to an aspect, the negatively charged object 110 attracts positively charged particles, such as protonated salts, away from objects in the lithographic apparatus, particularly objects, such as an optical element of the projection system PL and/or a substrate W, that would be adversely affected by contamination from the particles. In FIG. 2, the charged wire ring 110 surrounds a last optical element 100 of the projection system PL so as to primarily reduce or eliminate contamination of that element 100 by particles in the atmosphere in the vicinity of the element 100. In an implementation, the charged object 110 may have a positive charge capable of attracting particles, such as negatively charged particles (e.g., amines).

Figure 3:
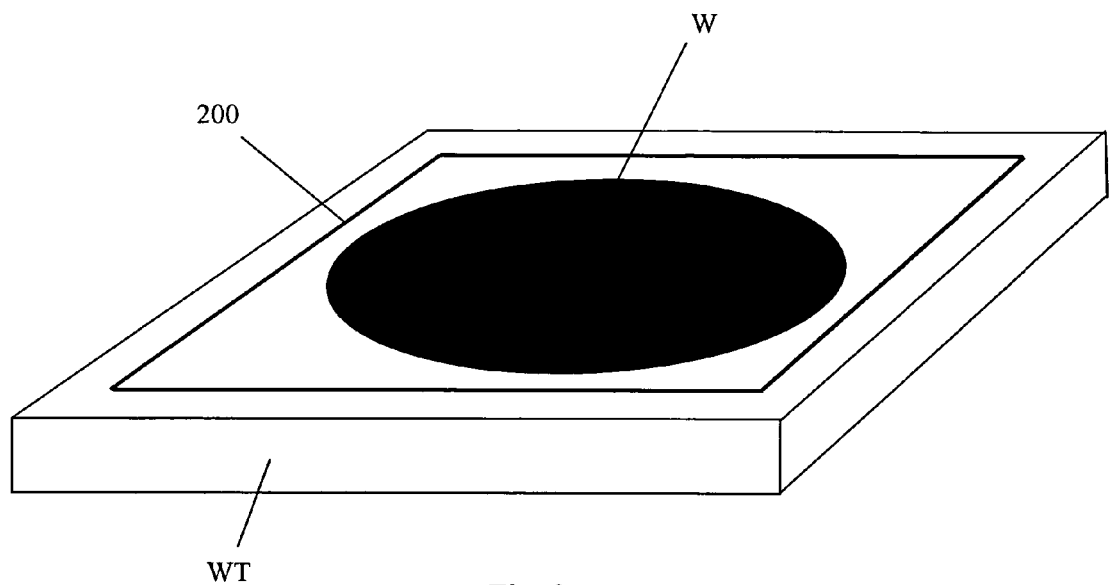
FIG. 3 depicts a substrate table having a charged object according to an embodiment of the invention.

Referring to FIG. 3, a substrate table WT of FIG. 1 is shown in more detail. A charged object 200 is provided on the substrate table WT. In an embodiment, the charged object 200 is a wire ring having a negative charge capable of attracting particles, such as positively charged particles (e.g., protonated salts), to the wire. In FIG. 3, the charged wire ring 200 surrounds a substrate W held by the substrate table WT so as to primarily reduce or eliminate contamination of that substrate W by particles in the atmosphere in the vicinity of the substrate W. In an implementation, the charged object 200 may have a positive charge capable of attracting particles, such as negatively charged particles (e.g., amines).

Figure 4:
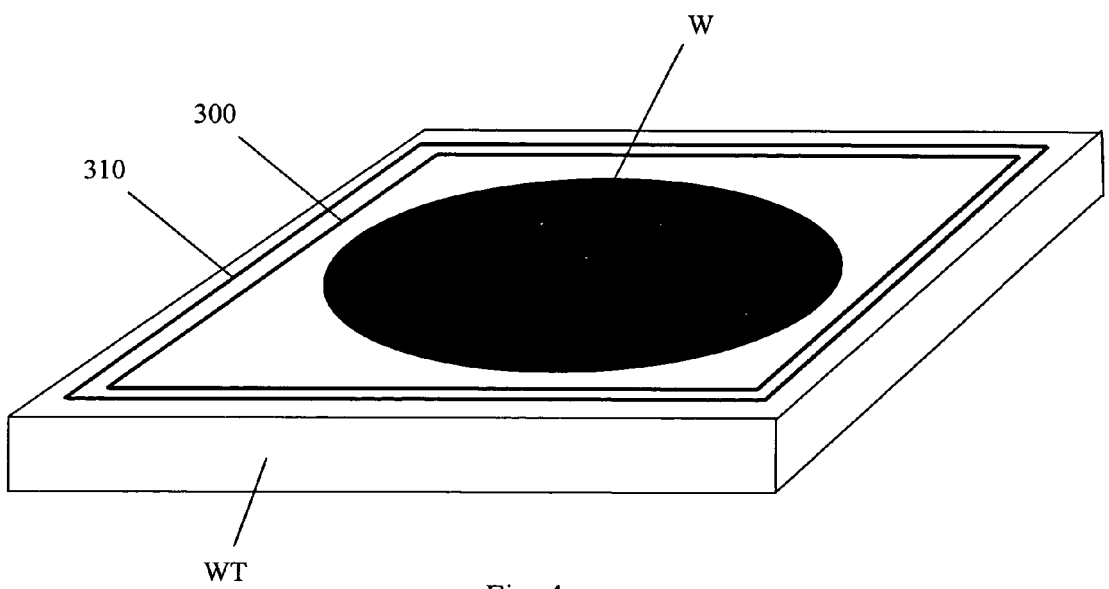
FIG. 4 depicts a substrate table having a charged object according to an embodiment of the invention.

Referring to FIG. 4, a substrate table WT of FIG. 1 is shown in more detail. A charged object comprising a first charged object 300 and a second charge object 310 are provided on the substrate table WT. In an embodiment, the first charged object 300 is a wire ring having a negative charge capable of attracting particles, such as positively charged particles (e.g., protonated salts), to the wire and the second charged object 310 is a wire ring having a positive charge capable of attracting particles, such as negatively charged particles (e.g., amines), to the wire. Alternatively, the first charged object 300 may be positively charged and the second charged object 310 may be negatively charged. In FIG. 4, the charged wire rings 300 and 310 surround a substrate W held by the substrate table WT so as to primarily reduce or eliminate contamination of that substrate W by particles in the atmosphere in the vicinity of the substrate W. With both positively and negatively charged objects, all types of particles may be attracted to the respective charged objects so as to keep those particles away from the substrate W (and other objects in the lithographic apparatus). In an embodiment, the charged objects 300 and 310 may be applied to the projection system PL shown in FIG. 2. The configuration and location of charged objects 300 and 310 should be selected, for example, to avoid interference of charged object 300 with the particle collection of charged object 310 (and vice versa), according to the physical design of the lithographic apparatus to attract most, if not all, particles in the vicinity of the substrate W, and/or to avert interference with the operation of the lithographic apparatus.

Figure 5:
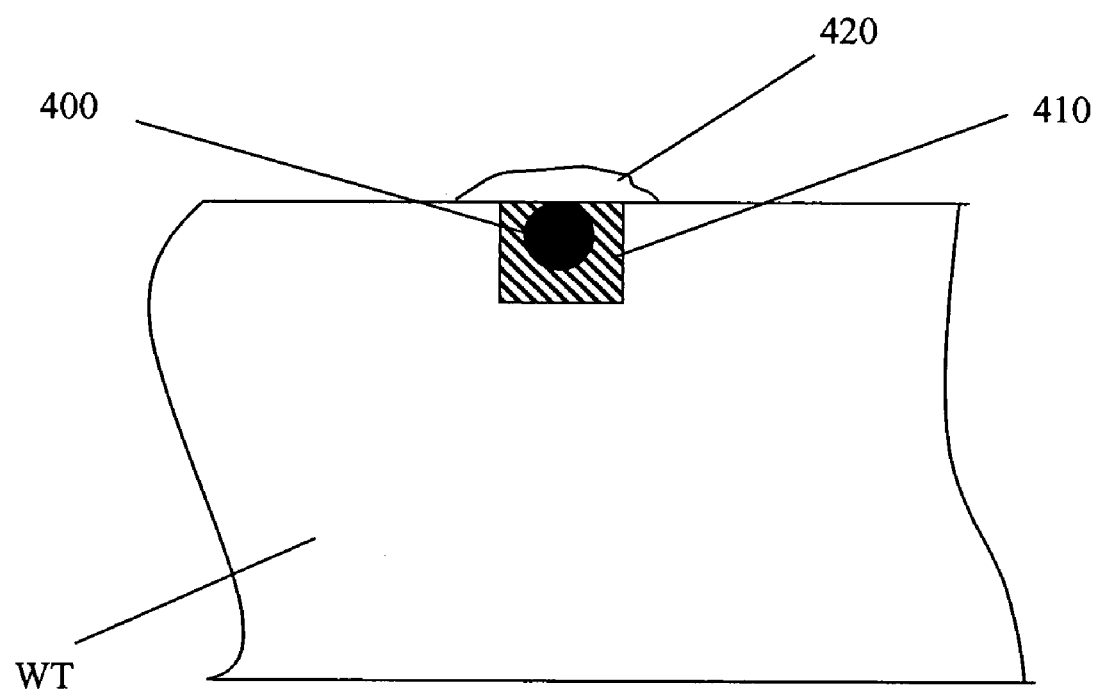
FIG. 5 depicts a detail of the charged object of FIGS. 3 and 4.

Referring to FIG. 5, a detailed cross-sectional view of a charged object, such as shown in FIG. 3 and/or 4, is depicted. As will be apparent, the charged object 400 may be provided, in addition or alternatively, on the projection system PL.

In FIG. 5 and according to an embodiment, the charged object 400 is in the form of a wire ring 400 embedded into a surface of the substrate table WT. The wire ring 400 is surrounded at least in part by insulation 410 so that the remainder of the substrate table WT won't have a charge due to the charged object 400.

Further, in an implementation, a particle disposal mechanism is provided to retain and/or remove particles attracted to the charged object. For example, referring to FIG. 5, a retaining substance 420, such as a thin layer of gel or adhesive (e.g., agarose or polyacrylamide), is provided to the charged object 400 (whether on the charged object 400 and/or adjacent thereto) and exposed to the atmosphere in the lithographic apparatus so that particles attracted toward the charged object 400 contact are held by the retaining substance 420. In an implementation, the retaining substance is neutral (i.e., no electric charge), non-volatile, and resistant to UV radiation and doesn't outgas.

In addition to a retaining substance, other particle disposal mechanisms may be employed. For example, a low pressure outlet, connected to a low pressure or vacuum source, may be provided at or adjacent to the charged object to facilitate removal of particles. So, when particles attracted to the charged object come close to the charged object, the particles may be drawn into the low pressure outlet and by an appropriate conduit expelled from the lithographic apparatus or collected in the lithographic apparatus for subsequent removal.

From time to time, the retaining substance 420 may be removed or cleaned to eliminate build up of particles collected. In an embodiment, the retaining substance 420 may be removed or cleaned by maintenance personnel. Alternatively or additionally, a substrate handler of the lithographic apparatus may be used. Conventionally, a substrate handler comprises a robot arm to supply and remove substrates on a substrate table WT of the lithographic apparatus. According to this embodiment then, the substrate handler may be programmed to remove or clean the retaining substance 420 on the substrate table WT and/or projection system PL. For example, the substrate handler may grab a container holding contaminated retaining substance 420 on the substrate table WT and/or projection system PL, remove it from the lithographic apparatus by taking it to an exit port of the lithographic apparatus, and supply a fresh container of retaining substance 420 to the substrate table WT and/or projection system PL. In another implementation, the substrate handler may use a cleaning tool to remove or clean the retaining substance 420 and, if necessary, apply additional retaining substance 420.

While shown as a continuous ring in FIGS. 2 to 4, the charged object need not be. For example, it could be discontinuous. The charged object could be one or more discrete charged objects. Further, the charged object need not be a wire. For example, the charged object could be one or more plates. Additionally, the charged object may be circular, square, rectangular, or any other shape, whether a ring or not.

Moreover, while the charged object has been described in relation to a projection system and a substrate table, the charged object may, in addition or alternatively, be applied to other parts of the lithographic apparatus, particularly sensitive parts such as interferometer components (e.g., interferometer mirrors) or sensors.

In each case, the type (positive/negative) and amount of charge selected for the charged object should be sufficient to attract particles in the relevant lithographic apparatus but not to interfere with the remainder of the lithographic apparatus. Also, the configuration and location of the charged object should be selected so as to effectively keep particles away from the parts of the lithographic apparatus for which the charged object is designed. Similarly, the type and amount of charge of the charged object as well as the configuration and location of the charged object may be selected to repel particles in the lithographic apparatus so as to keep particles away from the relevant sensitive parts of the lithographic apparatus. For example, referring to FIG. 2, the charged object 110 may be designed to repel particles away from the optical element 100, optionally to a particle disposal mechanism such as a retaining substance or a low pressure outlet.

Further, a charged object may switch in polarity from negative to positive and vice versa. For example, the charged object may have a negative charge for a certain period of time to attract positively charged particles and then switch to a positive charge for another period of time to attract negatively charged particles. In each period of time, a particle disposal mechanism may retain and/or remove particles attracted to the charged object.

While specific embodiments of the invention have been described above, it will be appreciated that the invention may be practiced otherwise than as described. The description is not intended to limit the invention.

The invention claimed is:

1. A lithographic apparatus comprising:
   an illuminator arranged to provide a beam of radiation;
   a support structure configured to hold a patterning device, the patterning device configured to impart the beam with a pattern in its cross-section;
   a substrate table configured to hold a substrate;
   a projection system arranged to project the patterned beam onto a target portion of the substrate; and
   a charged object on the substrate table configured to have an electric charge to attract particles thereto and configured as a ring to surround a substrate when placed on the substrate table.

2. The lithographic apparatus of claim 1, wherein the charged object has a negative electric charge to attract positively charged particles.

3. The lithographic apparatus of claim 1, wherein the charged object has a positive charge to attract negatively charged particles.

4. The lithographic apparatus of claim 1, wherein the charged object comprises a first charged object having a positive charge to attract negatively charged particles and second charged object having a negative electric charge to attract positively charged particles.

5. The lithographic apparatus of claim 1, further comprising a second charged object on the projection system and is configured as a ring to surround a last optical element of the projection system before the substrate table.

6. The lithographic apparatus of claim 1, wherein the charged object is insulated at least in part so as not to provide a charge to the substrate table.

7. The lithographic apparatus of claim 1, comprising a particle disposal mechanism configured to retain, remove, or both retain and remove particles attracted to the charged object.

8. The lithographic apparatus of claim 7, wherein the particle disposal mechanism comprises a retaining substance provided to the charged object to hold particles attracted to the charged object.

9. The lithographic apparatus of claim 8, wherein the retaining substance comprises a layer of gel or adhesive to hold the particles.

10. The lithographic apparatus of claim 8, comprising a substrate handler configured to remove or clean the retaining substance.

11. A device manufacturing method comprising:
    projecting a patterned beam of radiation, using a projection system of a lithographic apparatus, onto a target portion of a substrate held on a substrate table of a lithographic apparatus; and
    using an electric charge on the substrate table to attract particles thereto, the electric charge, configured as a ring, surrounding the substrate.

12. The method of claim 11, wherein the electric charge is a negative electric charge to attract positively charged particles, a positive charge to attract negatively charged particles, or the electric charge comprises a first electric charge that is a negative electric charge to attract positively charged particles and a second electric charge that is a positive charge to attract negatively charged particles.

13. The method of claim 11, further comprising a second electric charge is on the projection system that surrounds a last optical element of the projection system before the substrate table.

14. The method of claim 11, comprising insulating the electric charge from the substrate table.

15. The method of claim 11, comprising retaining, removing, or both retaining and removing particles attracted to the electric charge.

16. The method of claim 15, comprising retaining particles attracted to the electric charge using a retaining substance provided to the charge.

17. The method of claim 16, wherein the retaining substance comprises a layer of gel or adhesive to hold the particles.

18. The method of claim 16, comprising removing or cleaning the retaining substance using a substrate handler.

* * * * *